United States Patent
Lin et al.

(10) Patent No.: US 7,347,228 B2
(45) Date of Patent: Mar. 25, 2008

(54) METHOD OF MAKING SEMICONDUCTOR DEVICES

(75) Inventors: Cha-Hsin Lin, Hsinchu (TW); Zing-Way Pei, Hsinchu (TW); Shing-Chii Lu, Hsinchu (TW); Wen-Yi Hsieh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/300,481

(22) Filed: Dec. 15, 2005

(65) Prior Publication Data

US 2006/0094135 A1    May 4, 2006

Related U.S. Application Data

(63) Continuation of application No. 11/018,242, filed on Dec. 22, 2004, now Pat. No. 7,033,899.

(30) Foreign Application Priority Data

Aug. 18, 2004   (TW) .............................. 93124836 A

(51) Int. Cl.
    *H01L 21/331*   (2006.01)
(52) U.S. Cl. .............................. 138/313; 257/E21.375
(58) Field of Classification Search ................ 438/197, 438/199, 213, 220, 223–224, 227–228, 275–276, 438/279, 289–291, 308, 473–474, 476, 480, 438/515, 517, 526–527, 529–531, 542, 546–549, 438/551–553, 563, 567, 761–762, 765–766, 438/769–772, 774–778, 782–784, 786–788
    See application file for complete search history.

(56) References Cited

U.S. PATENT DOCUMENTS

| | | | | |
|---|---|---|---|---|
| 5,556,793 | A * | 9/1996 | Adler et al. ................ | 438/473 |
| 6,077,735 | A * | 6/2000 | Ezaki et al. ................ | 438/225 |
| 6,146,972 | A | 11/2000 | Yamamoto | |
| 6,780,725 | B2 * | 8/2004 | Fujimaki ................... | 438/313 |
| 2003/0013280 | A1 * | 1/2003 | Yamanaka .................. | 438/487 |
| 2003/0219952 | A1 * | 11/2003 | Fujimaki .................... | 438/322 |
| 2005/0013151 | A1 * | 1/2005 | Nathanson et al. .......... | 365/63 |

OTHER PUBLICATIONS

"Local Mechanical-Stress Control (LMC): A New Technique for CMOS-Performance Enhancement", A. Shimizu et al.; Hitachi ULSI Systems, Co., Ltd.; IEEE 2001; pp. 19.4.1-19.4.4.

* cited by examiner

*Primary Examiner*—Michael Lebentritt
*Assistant Examiner*—Andre' Stevenson
(74) *Attorney, Agent, or Firm*—Rabin & Berdo, P.C.

(57) ABSTRACT

A method for fabricating semiconductor device is provided. A high stress layer formed on, under or on both sides of the transistors of the semiconductor device is employed as a cap layer. A specific region is then defined through photo resistor mask, and the stress of the region is changed by ion implanting. Therefore, compressive stress and tensile stress occur on the high stress layer. According the disclosed method, the high stress layer may simultaneously improve the characteristics of the transistors formed on the same wafer. Further, the mobility of the carriers of the device is enhanced.

15 Claims, 4 Drawing Sheets

METHOD OF MAKING SEMICONDUCTOR DEVICES

CROSS-REFERENCE TO RELATED APPLICATION

This is a Continuation of U.S. application Ser. No. 11/018,242 filed Dec. 22, 2004, which issued as U.S. Pat. No. 7,033,899 on Apr. 25, 2006.

This Non-provisional application claims priority under 35 U.S.C. § 119(a) on Patent Application No(s). 093124836 filed in Taiwan, R.O.C on Aug. 18, 2004, the entire contents of which are hereby incorporated by reference.

BACKGROUND OF THE INVENTION

1. Field of Invention

The invention relates to a fabrication method of semiconductor devices and, in particular, to a fabrication method of semiconductor devices that employs ion implantation to modulate the stress on a silicon nitride film in the semiconductor device.

2. Related Art

For a P-type metal oxide semiconductor (PMOS), the hole mobility can be improved by imposing a compressive stress in the channel region. On the other hand, for an N-type metal oxide semiconductor (NMOS), the electron mobility can be improved by imposing a tensile stress in the channel region. The stresses required to improve the carrier mobility in the channel region in these two types of transistors are opposite to each other.

Since the stress value and type of depositing a whole piece of silicon nitride film are fixed, therefore, one can only, choose one of the PMOS and NMOS to impose the required stress in the prior art. That is, one can only improve one type of devices at a time, but not both of them simultaneously.

There have been many ion implantation technologies disclosed to improve the layer stress in silicon nitride. For example, the U.S. Pat. No. 6,146,972 proposed a method that employs ion implantation to implant ions at 20% to 60% of the silicon nitride film to reduce the stress therein. Its dose is smaller than $1 \times 10^{15}$ cm$^{-2}$ to prevent defects on the lower silicon plate under the stress of the silicon nitride.

Besides, A. Shimizu, K. Hachimine et al. implant Ge into the silicon nitride film to release the stress in a certain region. For example, to improve the characteristics of PMOS, a silicon nitride film with a high compressive stress is deposited on the transistor as a cap layer. The stress in the silicon nitride film on the NMOS region on the same substrate is released using Ge implantation to prevent the desired NMOS characteristics from being changed. The opposite is performed if one wants to improve the NMOS characteristics.

Therefore, the prior art has not addressed and answered the question of how to simultaneously provide different stresses on different devices on the same wafer. Since a CMOS contains both PMOS and NMOS devices, it is thus imperative to provide a method that enables a silicon nitride film to present different stresses in different regions.

SUMMARY OF THE INVENTION

In view of the foregoing, an objective of the invention is to provide a fabrication method of semiconductor devices to solve the existing problems in the prior art. It uses a high stress material layer as the cap layer of the metal oxide semiconductor field effect transistor (MOSFET). The high stress material layer imposes an appropriate stress on the channel of the covered transistor, thereby increasing the carrier mobility.

To achieve the above objective, the disclosed method of making a semiconductor device includes the steps of: providing a semiconductor device; forming a plurality of high stress layers on/under the semiconductor device; coating photo resist on a region of the high stress layers; and performing ion implantation on the part of the semiconductor device that is not covered by photo resist to change the stress in the high stress layers.

According to the objective and principles of the invention, the material of the high stress layer is silicon nitride. The ion implantation is performed using one of the elements P, As, Sb or the compound $BF_2$ or their combination in any proportion.

In comparison with the prior art, the invention utilizes ion implantation to increase the stress in the silicon nitride. Compressive or tensile stress occurs to different regions through ion implantation. This solves the problem of only improving PMOS or NMOS but not both in the prior art. In addition, the selected ion implantation materials include As, $BF_2$, and Sb, which is not disclosed before. Although the prior art discloses the idea of adding the element P into silicon nitride to reduce its stress, its action is not exactly the same as the invention.

According to the objective and principles of the invention, different types of stress can be produced in specific regions of a same silicon nitride layer.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

The present invention will be apparent from the following detailed description, which proceeds with reference to the accompanying drawings, wherein the same references relate to the same elements.

FIGS. 1A to 1D show the steps in the disclosed method of making a semiconductor device. The order of the steps is not completely unchangeable or indispensable. Some steps can be performed at the same time, ignored, or added. The steps outlined here use a broader and simpler method to describe the characteristics of the invention and should not be used to restrict the order and the number of times a particular step should be performed.

First, a semiconductor device 100 is provided. It has one or more PMOS 101 and one or more NMOS 102. The semiconductor device 100 generally speaking can be prepared using the normal standard CMOS process on a silicon substrate 103.

Afterwards, at least one high stress layer 200 is formed on the semiconductor device 100 as a cap layer of the PMOS 101 and at least one NMOS 102. The material of the high stress layer 200 can be, for example, silicon nitride. Other choices such as TEOS, BPSG, PSG, BSG, SiO2 and $SiO_xN_y$, are also possible. The high stress layer 200 can be formed on the semiconductor device 100 using plasma enhanced chemical vapor deposition (PECVD) or low pressure chemical vapor deposition (LPCVD).

The high stress layer 200 is then covered by photo resist 300. Its position can be selected to be the one for PMOS 101 or NMOS 102.

Finally, ion implantation is performed on the part of the semiconductor device 100 that is not covered by the photo resist 300 to change the stress in the high stress layer 200. The ion implantation uses one of the elements P, As, Sb or the compound $BF_2$ or their combination in any proportion. The depth of the ion implantation is 5 to 90% of the thickness of the high stress layer 200.

Figure 1A:
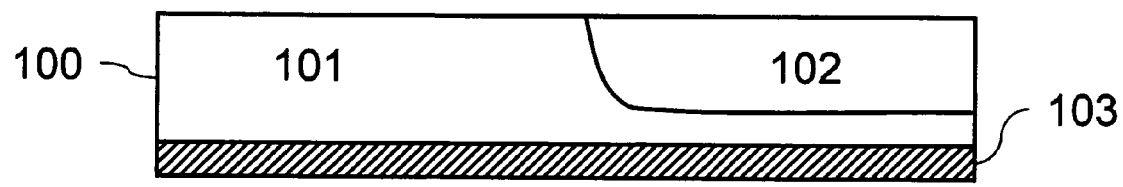
FIGS. 1A to 1D show the steps in the disclosed method of making a semiconductor device.
Figure 1B:
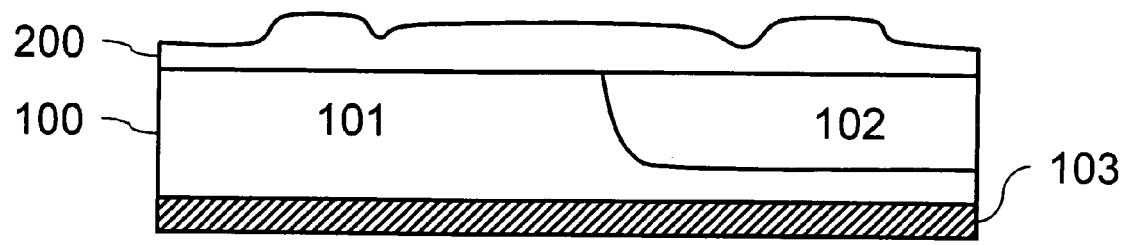
Figure 1C:
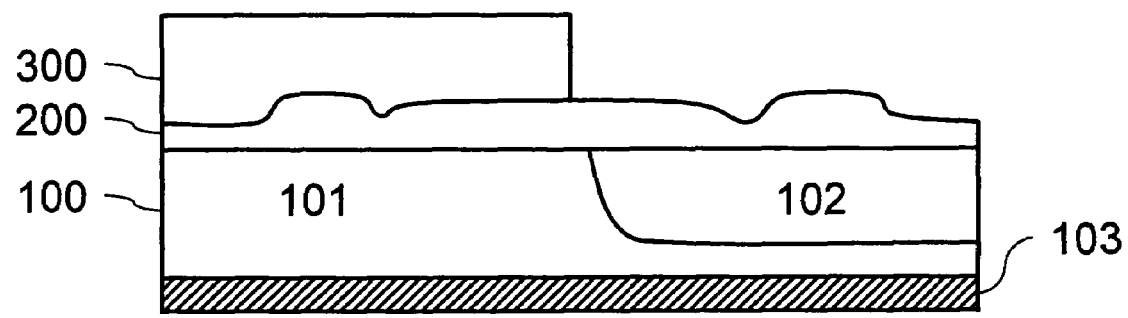
Figure 1D:
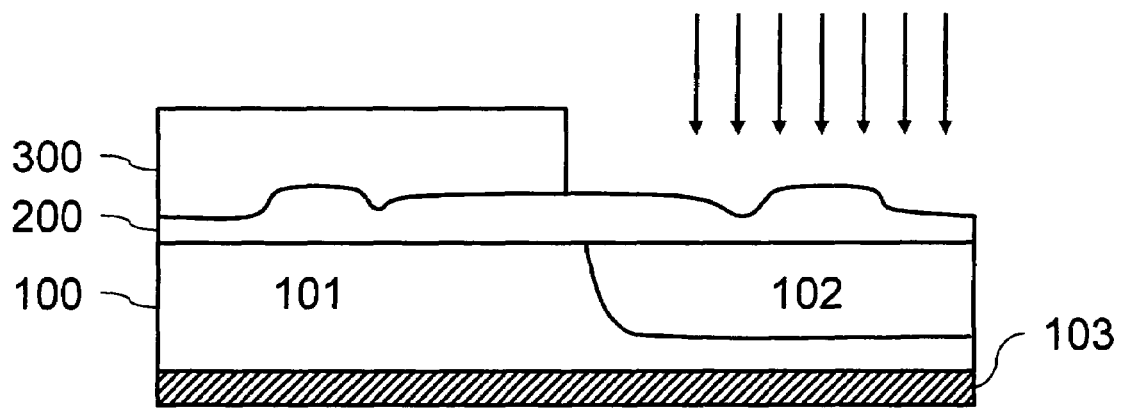
Figure 2:
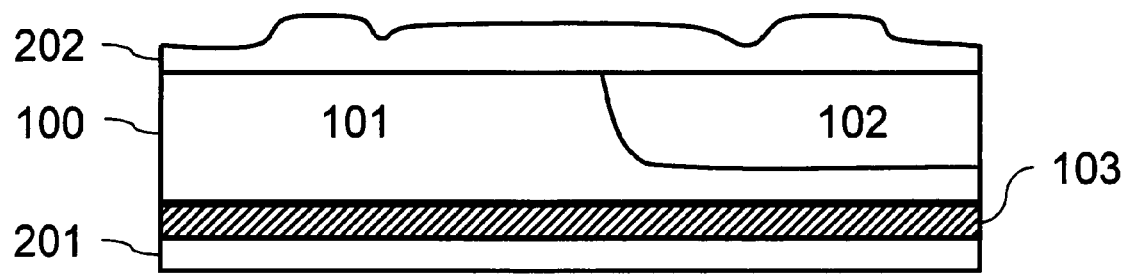
FIG. 2 shows the disclosed semiconductor device with two high stress layers.

In addition to the top of the semiconductor device 100, one may first form a high stress layer 201 at the bottom of the silicon substrate 103. After the semiconductor device 100 is formed, a second high stress layer 202 is then formed thereon, as shown in FIG. 2. The first high stress layer 201 and the second high stress layer 202 can be formed individually or together after forming the semiconductor device 100. The first high stress layer 201 under the silicon substrate 103 imposes a large force on the silicon substrate 103. Therefore, the second high stress layer 202 will greatly change the stress value and stress type in the second high stress layer 202 on the semiconductor device 100. Changing the thickness of the first high stress layer 201 under the silicon substrate 103 changes the force imposed on the silicon substrate 103, thereby adjusting the stress in the second high stress layer 202 on the semiconductor device 100.

According to the objective, principles, and implementation method of the invention, an annealing step may be used after the ion implantation to change the stress in the high stress layers.

According to the objective, principles, and implementation method of the invention, the stress type changes with the structural change in the atomic bonding. Therefore, ion implantation changes the stress type in the silicon nitride film, from compressive stress to the tensile stress and vice versa.

According to the objective, principles, and implementation method of the invention, the experimental results using the L2M30037.1 test chip are given in Tables 1 and 2. Table 1 shows the stress change in the silicon nitride film after single ion implantation. Table 2 shows the stress change in the silicon nitride film after twice ion implantation.

TABLE 1

| Test Chip | Test Chip | Process | Implanting Depth (nm) | Before (MPa) | After (MPa) | Change |
|---|---|---|---|---|---|---|
| 1 | PECVD $Si_3N_4$ 50 nm | Ion Implantation, 9500XR, P, 20 keV, 2E16 | 15.4 ± 6.5 | −263.5 | +3.8 | Δσ = +267.3 Tensile |
| 2 | PECVD $Si_3N_4$ 100 nm | Ion Implantation, 9500XR, As, 20 keV, 2E16 | 9.9 ± 3.3 | −390.3 | −239.9 | Δσ = +150.4 Tensile |
| 3 | PECVD $Si_3N_4$ 100 nm | Ion Implantation, 9500XR, BF2, 50 keV, 2E16 | 27.4 ± 8.3 | −382.5 | −80.2 | Δσ = +302.3 Tensile |
| 4 | PECVD $Si_3N_4$ 150 nm | Ion Implantation, 9500XR, Sb, 20 keV, 1E16 | 9 ± 2.4 | −346.6 | −310.9 | Δσ = +35.7 Tensile |
| 5 | LPCVD $Si_3N_4$ 100 nm | Ion Implantation, 9500XR, P, 40 keV, 2E16 | 30 ± 11.8 | +90.8 | −1015.4 | Δσ = −1106.2 Compressive |
| 6 | LPCVD $Si_3N_4$ 100 nm | Ion Implantation, 9500XR, As, 20 keV, 2E16 | 9.9 ± 3.3 | −90.3 | −626.6 | Δσ = −536.3 Compressive |

TABLE 2

| Test Chip | Test Chip | Process | Implanting Depth (nm) | Before (MPa) | After First Implantation (MPa) | After Second Implantation (MPa) |
|---|---|---|---|---|---|---|
| 1 | PECVD $Si_3N_4$ 50 nm | Ion Implantation P, 20 keV, 2E16 P, 30 keV, 5E15 | 22.6 ± 9.2 | −263.5 | +3.8 | −19.3 |
| 2 | PECVD $Si_3N_4$ 100 nm | Ion Implantation, As, 20 keV, 2E16 As, 120 keV, 5E15 | 43.3 ± 13.7 | −390.3 | −239.9 | −48 |
| 3 | PECVD $Si_3N_4$ 100 nm | Ion Implantation, BF2, 50 keV, 2E16 BF2, 80 keV, 2E16 | 43.2 ± 10.9 | −382.5 | −80.2 | −77.5 |
| 4 | PECVD $Si_3N_4$ 150 nm | Ion Implantation, 9500XR, Sb | — | — | — | — |
| 5 | LPCVD $Si_3N_4$ 100 nm | Ion Implantation, P, 40 keV, 2E16 P, 60 keV, 6E15 | 45.3 ± 16.8 | +90.8 | −1015.4 | −1190.4 |
| 6 | LPCVD $Si_3N_4$ 100 nm | Ion Implantation, As, 20 keV, 2E16 As, 120 keV, 5E15 | 43.3 ± 13.7 | −90.3 | −626.6 | −1335.3 |

TABLE 2-continued

| Test Chip | Test Chip | Process | Implanting Depth (nm) | Before (MPa) | After First Implantation (MPa) | After Second Implantation (MPa) |
|---|---|---|---|---|---|---|
| 7 | LPCVD Si₃N₄ 100 nm | Ion Implantation, Sb, 40 keV, 1E16 + Sb, 100 keV, 5E14 | 47.2 ± 12.8 | +14.6 | — | −1265.1 |

From Tables 1 and 2, it is clearly seen that ion implantation can greatly change the stress value in the silicon nitride film. The implanting depth also affects the stress change in the silicon nitride film. Moreover, the ion implantation method can change the stress type in the silicon nitride film, changing from tensile stress to compressive stress and vice versa.

Figure 3:
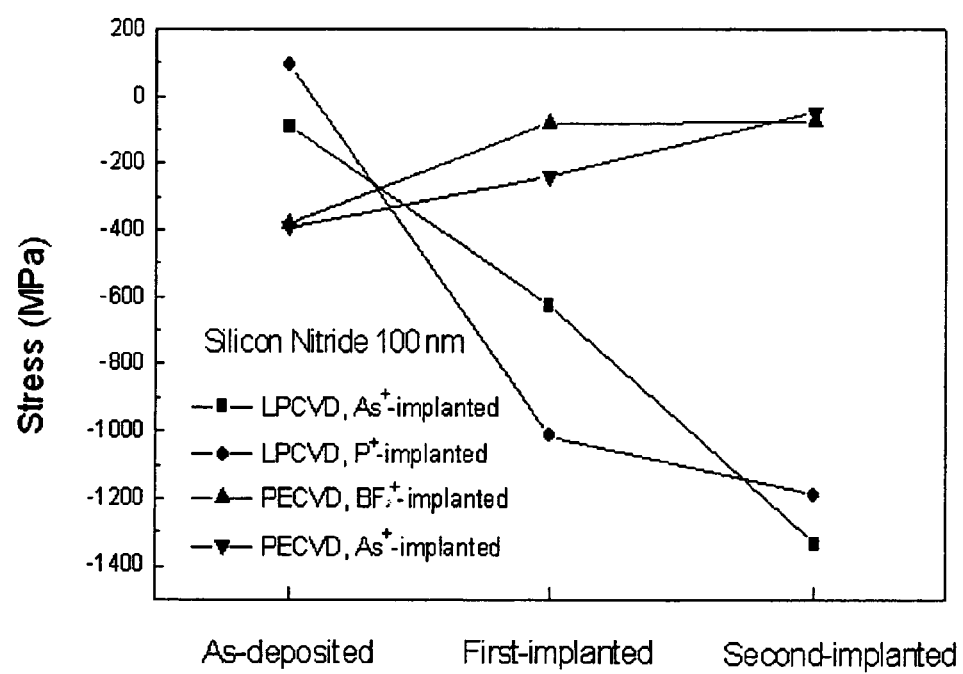
FIG. 3 shows that the stress in the PECVD or LPCVD silicon nitride film changes its direction after ion implantation.

With reference to FIG. 3, the stress change directions of the silicon nitride films formed by PECVD and LPCVD are opposite to each other. The silicon nitride film grown in the PECVD system changes toward the tensile stress after ion implantation, whereas that grown in the LPCVD system changes toward the compressive stress.

Figure 4:
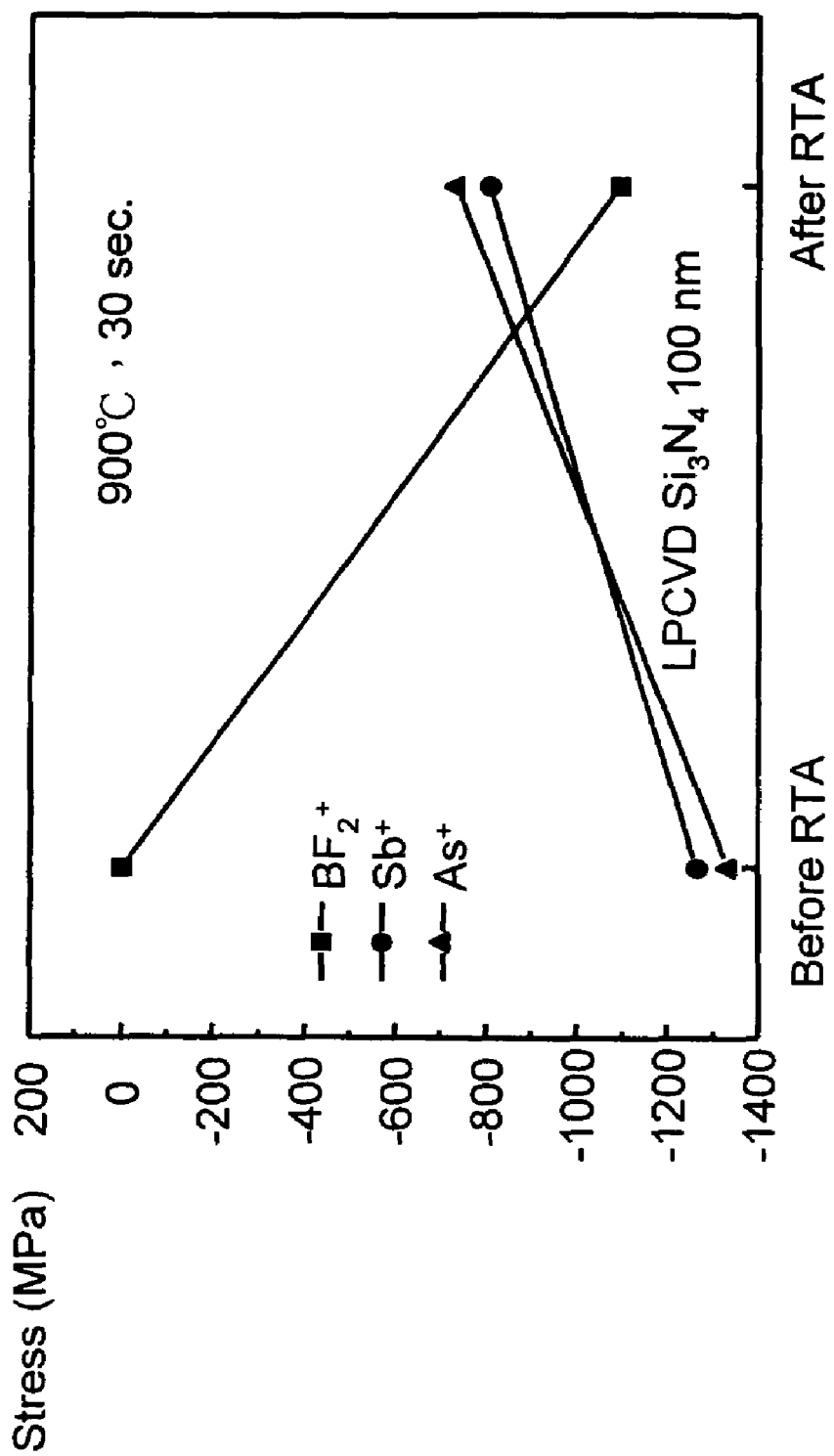
FIG. 4 gives the stress value of the ion implanted silicon nitride film after annealing.

FIG. 4 shows that the disclosed semiconductor device after ion implantation is annealed at the temperature of 900 degrees for 30 seconds. It still has a large stress value. The silicon nitride film after BF2+ implantation and annealing can even obtain an enhanced compressive stress.

According to the objective and principles of the invention, the method can be used for transistors with only one type, such as purely PMOS or purely NMOS. Ion implantation changes the stress type of the high stress layer 200 covered on the transistor, as shown in FIG. 1. The implanted element is again chosen from the elements P, As, Sb, the compound $BF_2$ or any of their combinations in arbitrary proportion. The ion implantation depth is between 5% and 90% of the thickness of the high stress layer 200.

According to the objective, principles, and implementation method of the invention, a silicon nitride film is used as the cap layer on the transistor. At the same time, ion implantation is employed for the silicon nitride film to present compressive and tensile stress on the PMOS and NMOS devices. The stress from the deposited silicon nitride film simultaneously improves the device characteristics of the NMOS and PMOS devices on the same chip.

According to the objective, principles, and implementation method of the invention, ion implantation with different elements are employed to change the stress in the silicon nitride film, reversing its type. Therefore, properly treating the same layer of silicon nitride can produce different types of stress in specific regions. Using the ion implantation method can change the compressive type to the tensile type and vice versa.

Although the invention has been explained by the embodiments shown in the drawings described above, it should be understood by the person ordinary skilled in the art that the invention is not limited to these embodiments, but rather that various changes or modifications thereof are possible without departing from the spirit and scope of the invention. Accordingly, the scope of the invention shall be determined only by the appended claims and their equivalents.

What is claimed is:

1. A method of making semiconductor devices, comprising the steps of:

providing a plurality of semiconductor devices on a substrate;

forming at least one high stress layer covering the plurality of semiconductor devices;

coating photo resist on a first region of the high stress layer that covers at least one but less than all of the plurality of semiconductor devices; and modifying the stress of a second region of the at least one high stress layer not covered by the photo resist by performing ion implantation to implant ions in the second region of the at least one high stress layer, so that the stresses of the first and second regions differ from each other, wherein the ions comprise the elements P, As, Sb, or the compound $BF_2$.

2. The method of claim 1, wherein the step of providing a plurality of semiconductor devices includes providing a PMOS and a NMOS, one of the first and second regions of the high stress layer covering the PMOS, the other of the first and second regions of the high stress layer covering the NMOS.

3. The method of claim 1, wherein the step of providing a plurality of semiconductor devices includes providing a plurality of PMOS and a plurality of NMOS.

4. The method of claim 1, wherein the material of the at least one high stress layer comprises silicon nitride, TEOS, BPSG, PSG, BSG, SiO2, or $SiO_xN_y$.

5. The method of claim 1, wherein the step of forming the at least one high stress layer includes using a method selected from plasma enhanced chemical vapor deposition (PECVD) and low pressure chemical vap or deposition (LPCVD).

6. The method of claim 1, wherein the at least one high stress layer has a thickness, and wherein the ion implantation takes place to an implantation depth which ranges between 5% and 49% of the thickness of the at least one high stress layer.

7. The method of claim 1, further comprising annealing, after modifying the stress of a second region by performing ion implantation, to change the stress in the at least one high stress layer.

8. A method of making semiconductor devices, comprising the steps of:

providing a substrate;

forming at least one first high stress layer under the substrate;

forming the semiconductor devices on the substrate;

forming at least one second high stress layer covering the semiconductor devices;

coating photo resist on a first region of the second high stress layer that covers at least one but less than all of the semiconductor devices; and modifying the stress of a second region of the second high stress layer not covered by the photo resist by performing ion implantation to implant ions in the second region of the second high stress layer, so that the stresses of the first and second regions differ from each other.

9. The method of claim 8, wherein the step of providing a plurality of semiconductor devices includes providing a PMOS and a NMOS, one of the first and second regions of the second high stress layer covering the PMOS, the other of the first and second regions of the second high stress layer covering the NMOS.

10. The method of claim 8, wherein the step of providing a plurality of semiconductor devices includes providing a plurality of PMOS and a plurality of NMOS.

11. The method of claim 8, wherein the material of at least one of the first and second high stress layers comprises silicon nitride, TEOS, BPSG, PSG, BSG, SiO2, or $SIO_xN_y$.

12. The method of claim 8, wherein at least one of the step of forming the first high stress layer and the step of forming the second high stress layer includes using a method selected from plasma enhanced chemical vapor deposition (PECVD) and low pressure chemical vapor deposition (LPCVD).

13. The method of claim 8, wherein the ions implanted comprise the elements P, As, Sb, or the compound $BF_2$.

14. The method of claim 8, wherein the first and second high stress layers have respective thicknesses, and wherein the ion implantation takes place to an implantation depth which ranges between 5% and 90% of the thickness of at least one of the first and second high stress layers.

15. The method of claim 8, further comprising annealing, after modifying the stress of the second region by performing ion implantation, to change the stress in the first and second high stress layers.

* * * * *